(12) United States Patent
Wu et al.

(10) Patent No.: US 12,362,185 B2
(45) Date of Patent: Jul. 15, 2025

(54) METHOD FORMING GATE STACKS ADOPTING THIN SILICON CAP

(71) Applicant: Taiwan Semiconductor Manufacturing Co., Ltd., Hsinchu (TW)

(72) Inventors: Jyun-Yi Wu, Hsinchu (TW); Chung-Yi Su, Taipei (TW); Tsung-Da Lin, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 554 days.

(21) Appl. No.: 17/663,050

(22) Filed: May 12, 2022

(65) Prior Publication Data

US 2023/0238241 A1 Jul. 27, 2023

Related U.S. Application Data

(60) Provisional application No. 63/267,154, filed on Jan. 26, 2022.

(51) Int. Cl.
*H01L 21/28* (2025.01)
*H10D 30/01* (2025.01)
*H10D 64/01* (2025.01)

(52) U.S. Cl.
CPC ..... *H01L 21/28185* (2013.01); *H10D 30/024* (2025.01); *H10D 64/017* (2025.01)

(58) Field of Classification Search
None
See application file for complete search history.

(56) References Cited

U.S. PATENT DOCUMENTS

| 11,264,478 | B2 | 3/2022 | More et al. |
| 11,842,928 | B2 | 12/2023 | Tsai et al. |
| 2017/0250278 | A1* | 8/2017 | Tsai ................. H01L 29/66795 |
| 2019/0019682 | A1 | 1/2019 | Galatage et al. |
| 2020/0126797 | A1 | 4/2020 | Wang et al. |
| 2020/0373206 | A1* | 11/2020 | Cheng ............... H01L 29/42392 |

(Continued)

FOREIGN PATENT DOCUMENTS

| KR | 20200037106 A | 4/2020 |
| KR | 20200047295 A | 5/2020 |

(Continued)

*Primary Examiner* — Feifei Yeung Lopez
(74) *Attorney, Agent, or Firm* — Slater Matsil, LLP

(57) ABSTRACT

A method includes forming a dummy gate stack on a semiconductor region, forming gate spacers on sidewalls of the dummy gate stack, removing the dummy gate stack to form a recess between the gate spacers, and forming a silicon oxide layer on the semiconductor region. The silicon oxide layer extends into the recess. A high-k dielectric layer is deposited over the silicon oxide layer, and a silicon layer is deposited over the high-k dielectric layer. The silicon layer extends into the recess. The high-k dielectric layer and the silicon layer are in-situ deposited in a same vacuum environment. The method further includes performing an annealing process on the silicon layer and the high-k dielectric layer, removing the silicon layer, and forming a gate electrode over the high-k dielectric layer. The gate electrode fills the recess.

20 Claims, 26 Drawing Sheets

(56) References Cited

U.S. PATENT DOCUMENTS

| | | |
|---|---|---|
| 2020/0381529 A1 | 12/2020 | Tsai et al. |
| 2021/0175070 A1 | 6/2021 | Cheng et al. |
| 2021/0202747 A1 | 7/2021 | Young et al. |
| 2021/0257258 A1 | 8/2021 | Huang et al. |

FOREIGN PATENT DOCUMENTS

| | | |
|---|---|---|
| KR | 20200128756 A | 11/2020 |
| KR | 20210053118 A | 5/2021 |
| KR | 20210106324 A | 8/2021 |
| KR | 20210143629 A | 11/2021 |

\* cited by examiner

METHOD FORMING GATE STACKS ADOPTING THIN SILICON CAP

PRIORITY CLAIM AND CROSS-REFERENCE

This application claims the benefit of the following provisionally filed U.S. Patent application: Application No. 63/267,154, filed on Jan. 26, 2022, and entitled "Gate Stack Scheme with Ultra-Thin Si-cap for CET Control and Gap-Fill Window," which application is hereby incorporated herein by reference.

BACKGROUND

Transistors are basic building elements in integrated circuits. In the development of the integrated circuits, Fin Field-Effect Transistors (FinFETs) have been used to replace planar transistors. In the formation of FinFETs, semiconductor fins are formed, and dummy gates are formed on the semiconductor fins. The formation of the dummy gates may include depositing a dummy layer such as a polysilicon layer, and then patterning the dummy layer as dummy gates. Gate spacers are formed on the sidewalls of the dummy gate stacks. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
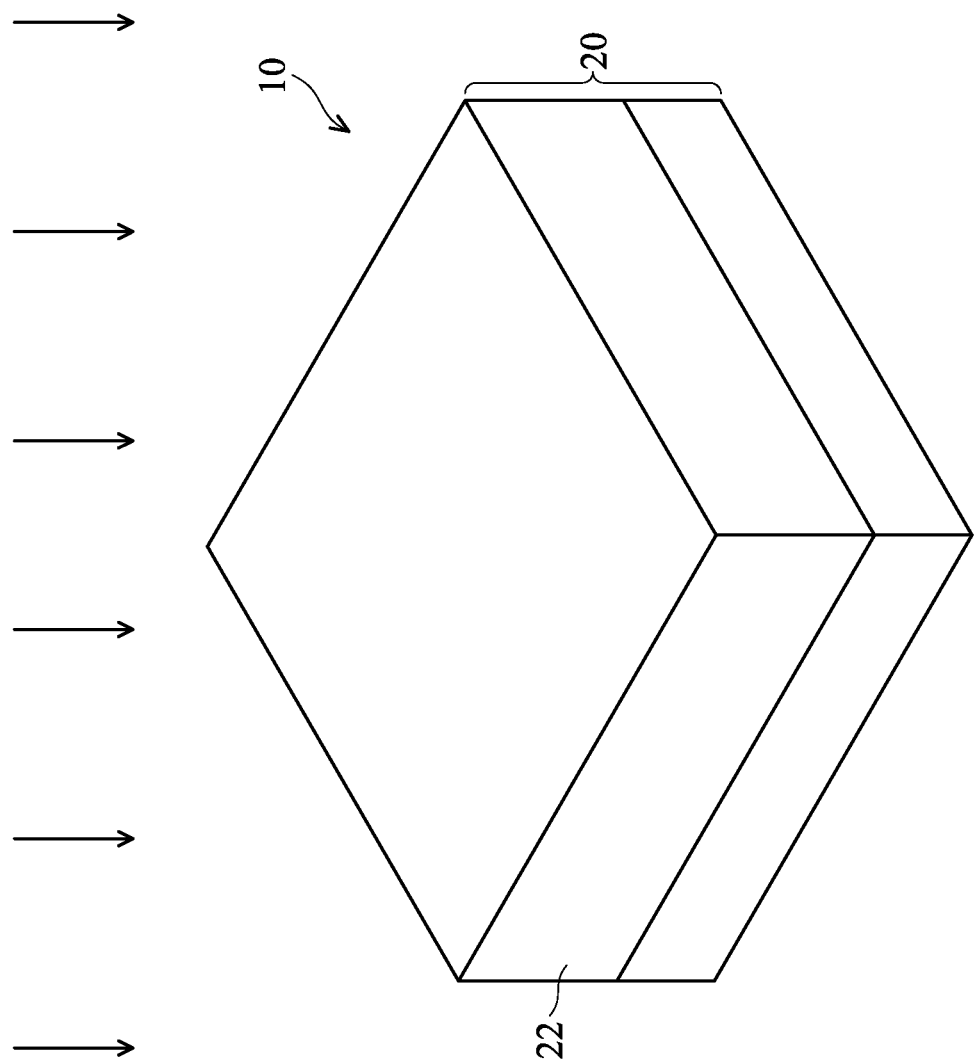
FIGS. 1-9, 10A, 10B, 10C, 11A, 11B, 11C, 12A, 12B, 13A, 13B, 14A, 14B, 15A, 15B, 15C and 16 illustrate perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided. In accordance with some embodiments of the present disclosure, a dummy gate stack is formed on a protruding semiconductor fin. The dummy gate stack is removed, followed by the formation of an interfacial layer and a high-k dielectric layer on the protruding semiconductor fin. A metal-containing capping layer and a silicon cap layer are then in-situ deposited on the high-k dielectric layer. An annealing process is performed to improve the quality of the high-k dielectric layer. By in-situ depositing the silicon cap layer on the metal-containing capping layer, the adsorption of oxygen on the metal-containing capping layer is avoided, and the adverse diffusion of the oxygen to the protruding semiconductor fin is avoided or at least reduced. The adverse increase in the thickness of the interfacial layer due to the oxygen diffusion and the annealing process is avoided. It is appreciated that although FinFETs are discussed as examples, the embodiments may also be applied to other types of transistors such as planar transistors, Gate-All-Around (GAA) transistors, or the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-9, 10A, 10B, 10C, 11A, 11B, 11C, 12A, 12B, 13A, 13B, 14A, 14B, 15A, 15B, 15C and 16 illustrate the perspective views and cross-sectional views of intermediate stages in the formation of a FinFET having a replacement gate stack in accordance with some embodiments of the present disclosure. The corresponding processes are also reflected schematically in the process flow 200 as shown in FIG. 17.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 17. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
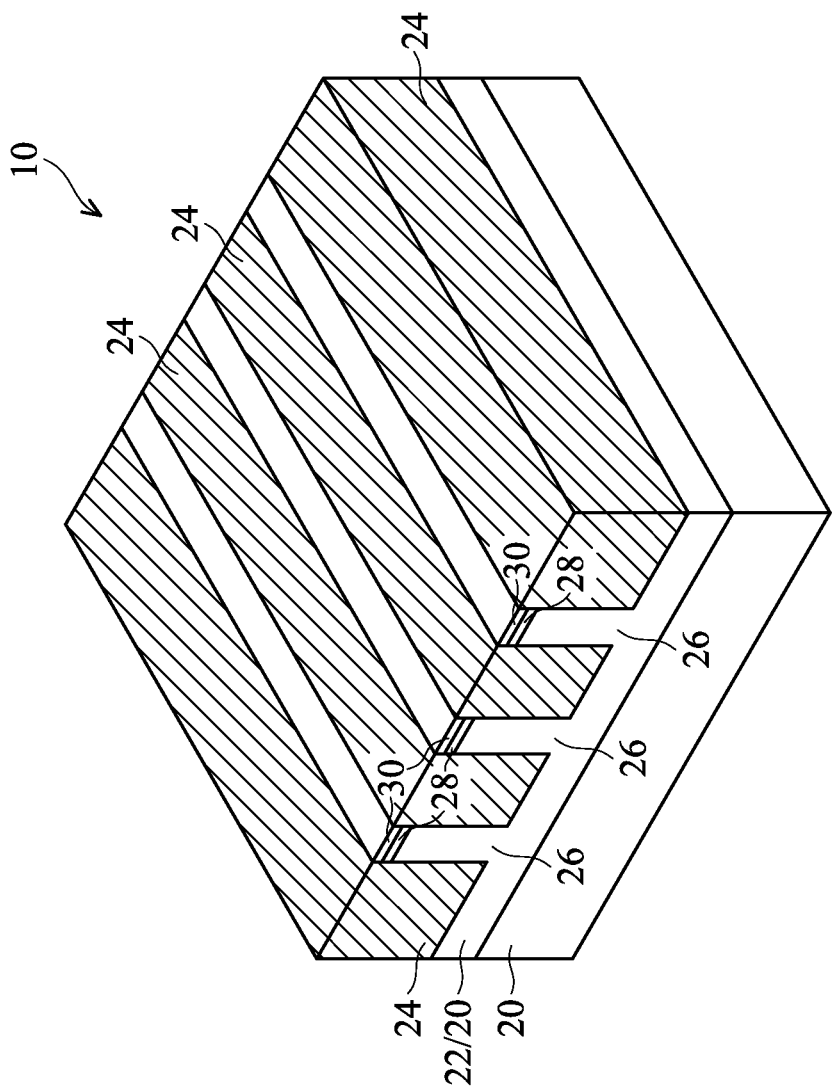

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 17. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30.

In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photoresist (not shown) is formed on hard mask layer 30 and is then patterned. Hard mask layer 30 is then patterned using the patterned photoresist as an etching mask to form hard mask layer 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
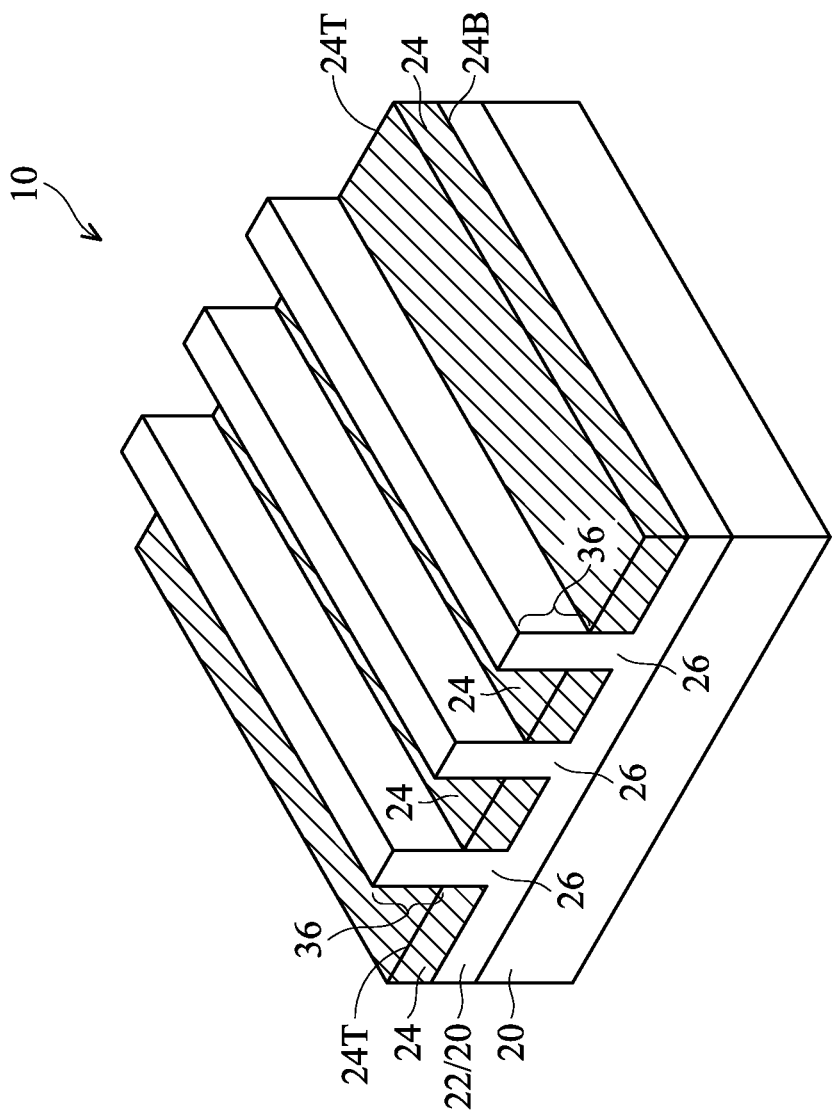

Referring to FIG. 3, STI regions 24 are recessed. The top portions of semiconductor strips 26 thus protrude higher than the top surfaces 24T of the remaining portions of STI regions 24 to form protruding fins 36. The respective process is illustrated as process 206 in the process flow 200 as shown in FIG. 17. The etching may be performed using a dry etching process, wherein HF and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example. The top surfaces and the bottom surfaces of STI regions 24 are referred to as 24T and 24B, respectively.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In accordance with some embodiments, a silicon capping layer (not shown) may be deposited as a conformal layer on protruding semiconductor fins 36, for example, through ALD, CVD, or the like. For example, when protruding semiconductor fins 36 comprise silicon germanium, the silicon capping layer may reduce the oxidation in subsequent processes. The formation of silicon capping layer may be performed through a selective deposition (such as selective epitaxy) process, and hence is formed on the surfaces of protruding semiconductor fins 36, but not on the surfaces of STI regions 24. In accordance with alternative embodiments, the silicon capping layer is deposited as a blanket layer on the surfaces of both of protruding semiconductor fins 36 and STI regions 24.

Figure 4:
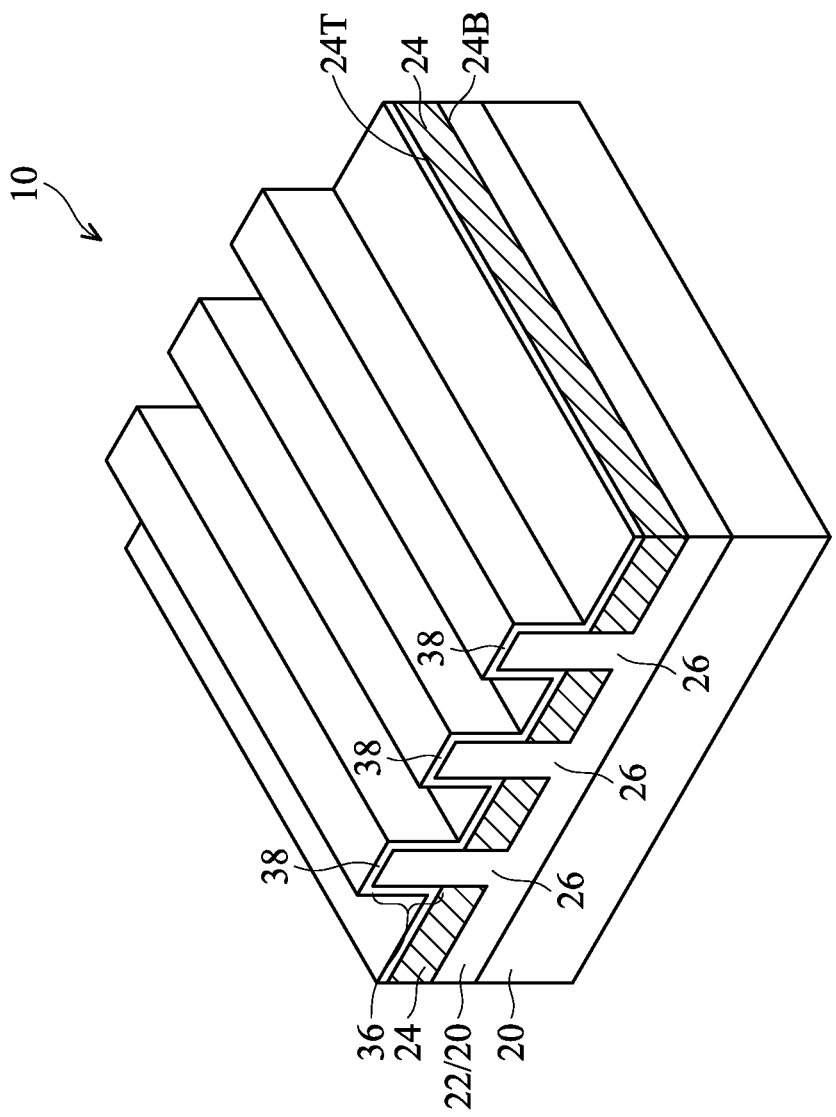
Figure 5:
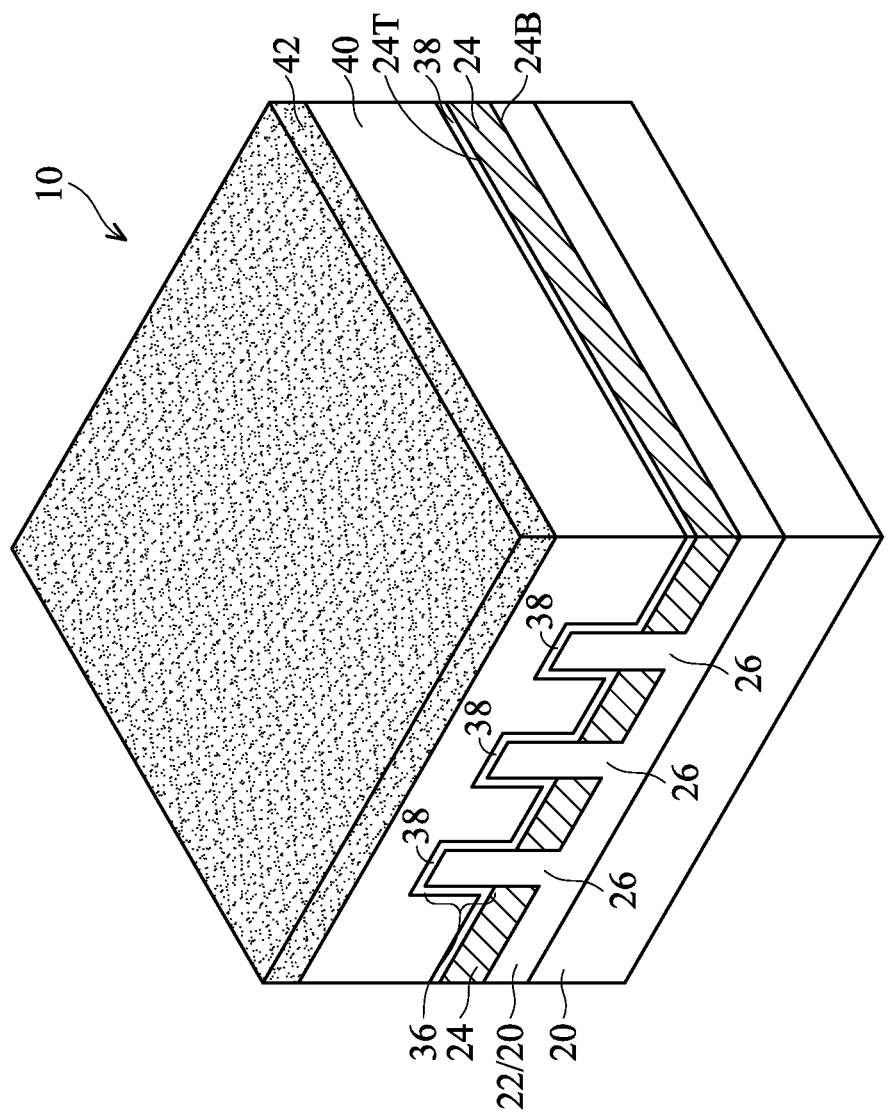
Figure 6:
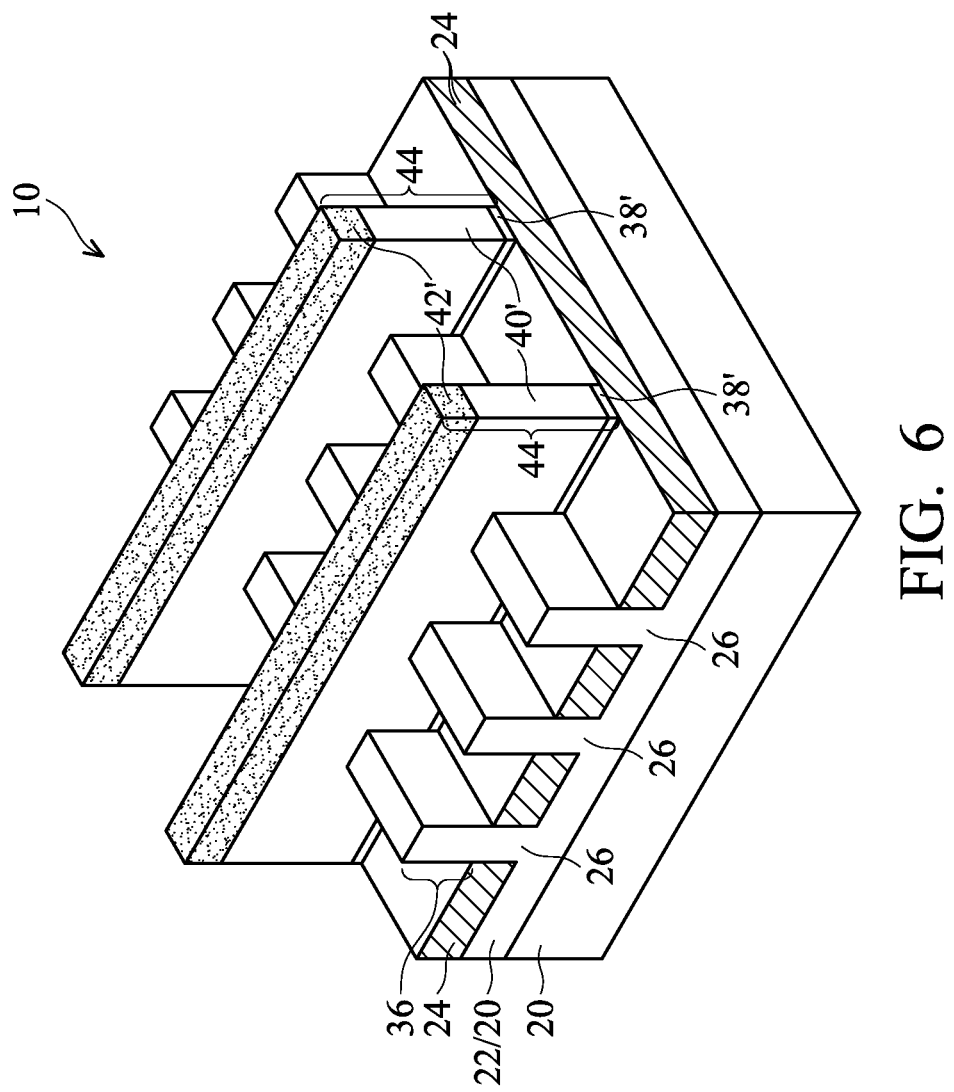

FIGS. 4-6 illustrate the formation of dummy gate stacks 44 in accordance with some embodiments. Referring to FIG. 4, dummy dielectric layer 38 is formed on the sidewalls and the top surfaces of protruding fins 36, and may be on the top surfaces of STI regions 24. The respective process is illustrated as process 208 in the process flow 200 as shown in FIG. 17. In accordance with some embodiments of the present disclosure, dummy dielectric layer 38 (also referred to as dummy gate dielectric layer 38) is formed using a deposition process, which may include Chemical Vapor Deposition (CVD), Atomic Layer Deposition (ALD), or the like. The precursors may include Silane, aminosilanes, disec-butylaminosilane (DSBAS), bis(tert-butylamino) silane (BTBAS), or the like, or combinations thereof as the silicon source gas. An oxidizing agent such as ozone ($O_3$), oxygen ($O_2$), or the like, or a combination thereof is also used as an oxygen source. The material of dummy dielectric layer 38 may include silicon oxide, while other dielectric materials such as silicon nitride, silicon carbo-nitride, silicon oxynitride, or the like, may also be used.

After the deposition of dummy gate dielectric layer 38, an annealing process may be performed. The annealing process may be performed at a temperature in the range between about 400° C. and about 1,000° C., depending on the method of the annealing. The annealing method may include Rapid Thermal Annealing, furnace annealing, spike annealing, or the like. The annealing process may improve the quality of dummy gate dielectric layer 38. In accordance with alternative embodiments, the annealing process is skipped.

FIG. 5 illustrates the deposition of dummy gate electrode layer 40. The respective process is illustrated as process 210 in the process flow 200 as shown in FIG. 17. Dummy gate electrode layer 40 may be formed of or comprise polysilicon or amorphous silicon, and other materials may also be used. The formation process may include a deposition process followed by a planarization process. Hard mask layer 42 is then deposited on dummy gate electrode layer 40. The respective process is illustrated as process 212 in the process flow 200 as shown in FIG. 17. Hard mask layer 42 may be formed of or comprise silicon nitride, silicon oxide, silicon oxy-carbo-nitride, or multi-layers thereof.

FIG. 6 illustrates the patterning process for forming dummy gate stacks 44. The respective process is illustrated as process 214 in the process flow 200 as shown in FIG. 17. In accordance with some embodiments of the present disclosure, hard mask layer 42 is first patterned, for example, using a patterned photoresist (not shown) as an etching mask. The resulting hard masks are referred to as hard masks 42'. Hard masks 42' are then used as an etching mask to etch the underlying dummy gate electrode layer 40 in order to form dummy gate electrodes 40'. The etching is performed using an anisotropic etching process.

The etching of dummy gate electrode layer 40, which may be formed of polysilicon or amorphous silicon, may be performed using a process gas that comprises fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or the mixture of HBr, $Cl_2$, $O_2$, and $CH_2F_2$ etc. Dummy gate dielectric layer 38 is then patterned to form dummy gate dielectrics 38', exposing the underlying STI regions 24.

In accordance with alternative embodiments, the patterning of dummy gate electrode layer 40 stops on dummy gate dielectric layer 38, and dummy gate dielectric layer 38 is not patterned. The subsequently formed gate spacers will be formed on the un-patterned dummy gate dielectric layer 38.

Figure 7:
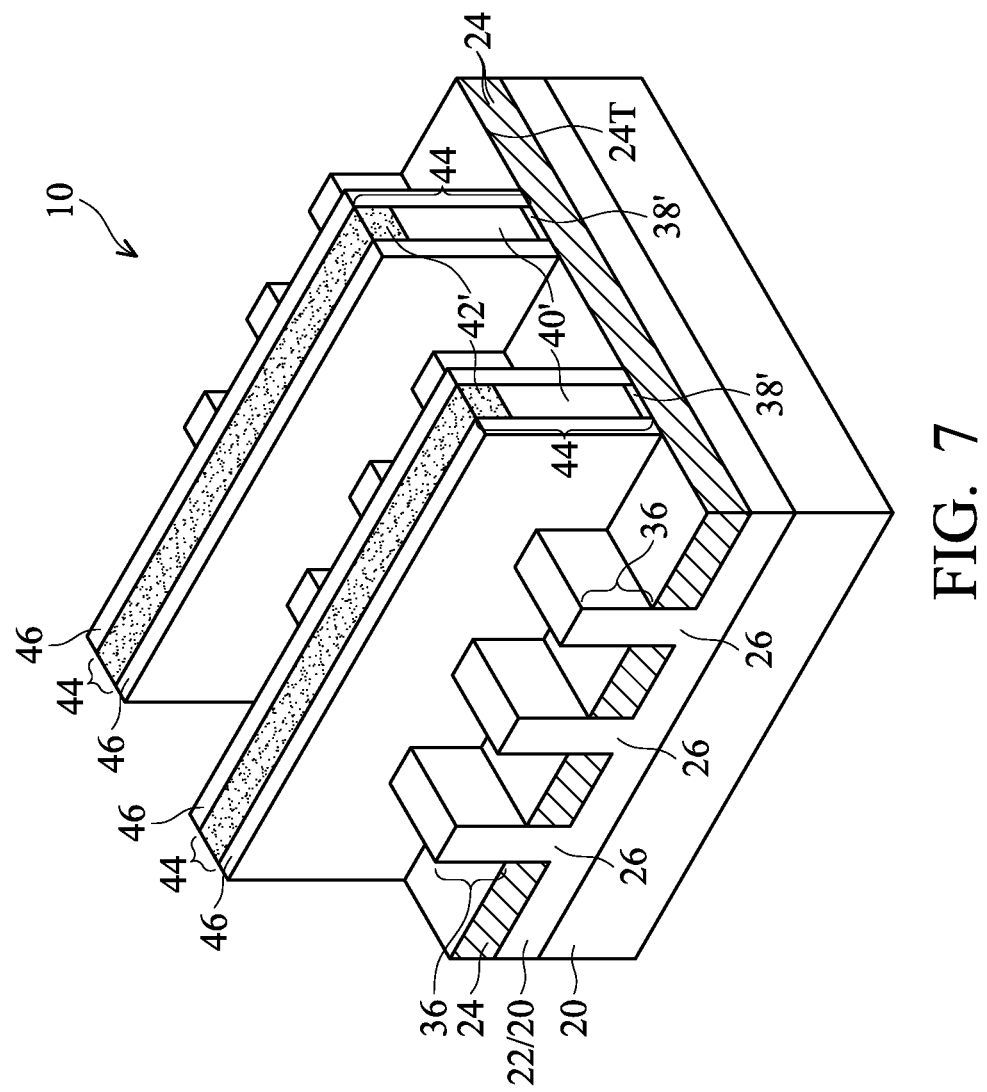

Next, as shown in FIG. 7, gate spacers 46 are formed on the sidewalls of dummy gate stacks 44. The respective process is illustrated as process 216 in the process flow 200 as shown in FIG. 17. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 8:
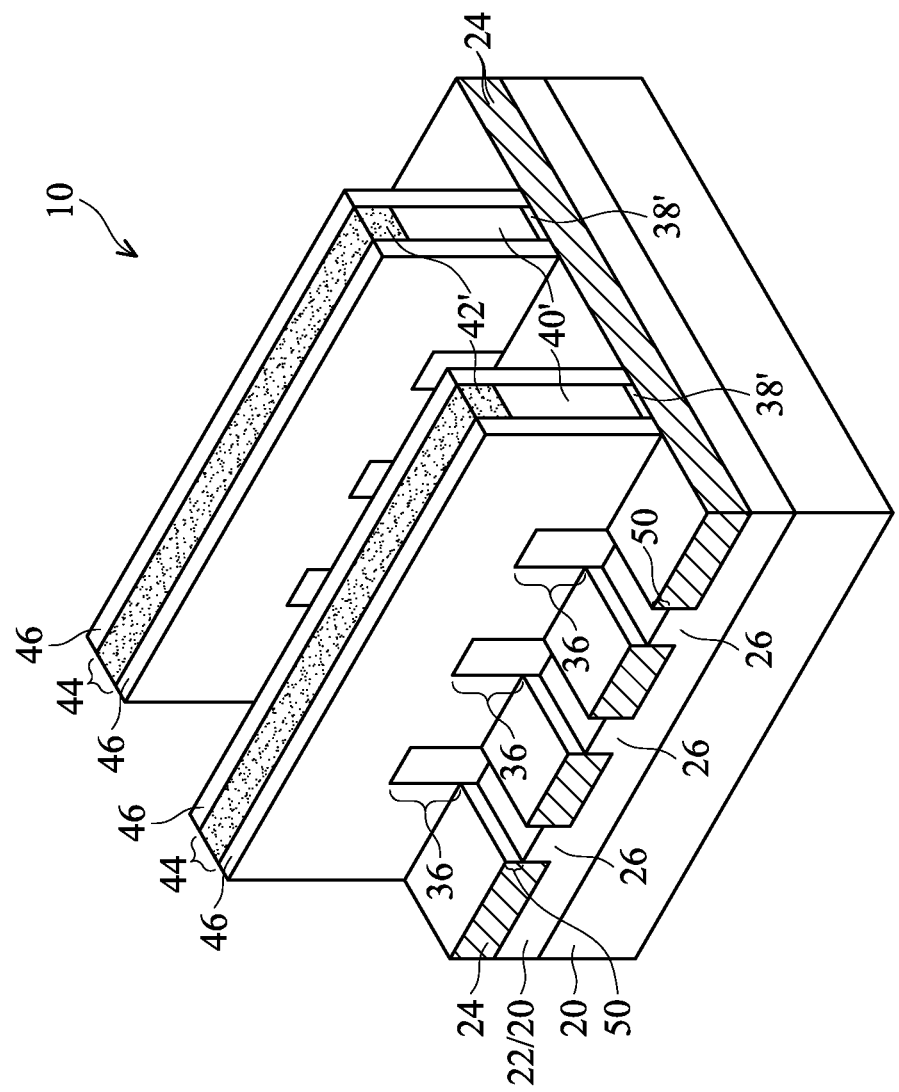

Referring to FIG. 8, an etching process(es) is performed to recess protruding fins 36. The respective process is illustrated as process 218 in the process flow 200 as shown in FIG. 17. If there are any portions of dummy gate dielectric layer 38 not directly underlying dummy gate stacks 44 and gate spacers 46, the exposed portions of dummy gate dielectric layer 38 are also removed. The portions of protruding fins 36 that are not covered by dummy gate stacks 44 and gate spacers 46 are also etched. The recessing may be anisotropic, and hence the portions of protruding fins 36 directly underlying dummy gate stacks 44 and gate spacers 46 are protected, and are not etched. The top surfaces of the recessed semiconductor strips 26 may be lower than the top surfaces 24T of STI regions 24 in accordance with some embodiments. Recesses 50 are accordingly formed. Recesses 50 comprise some portions located on the opposite sides of dummy gate stacks 44, and some portions between remaining portions of protruding fins 36. There may be, or may not be, fin spacers left on the opposite sides of recesses 50, which fin spacers are not illustrated.

Figure 9:
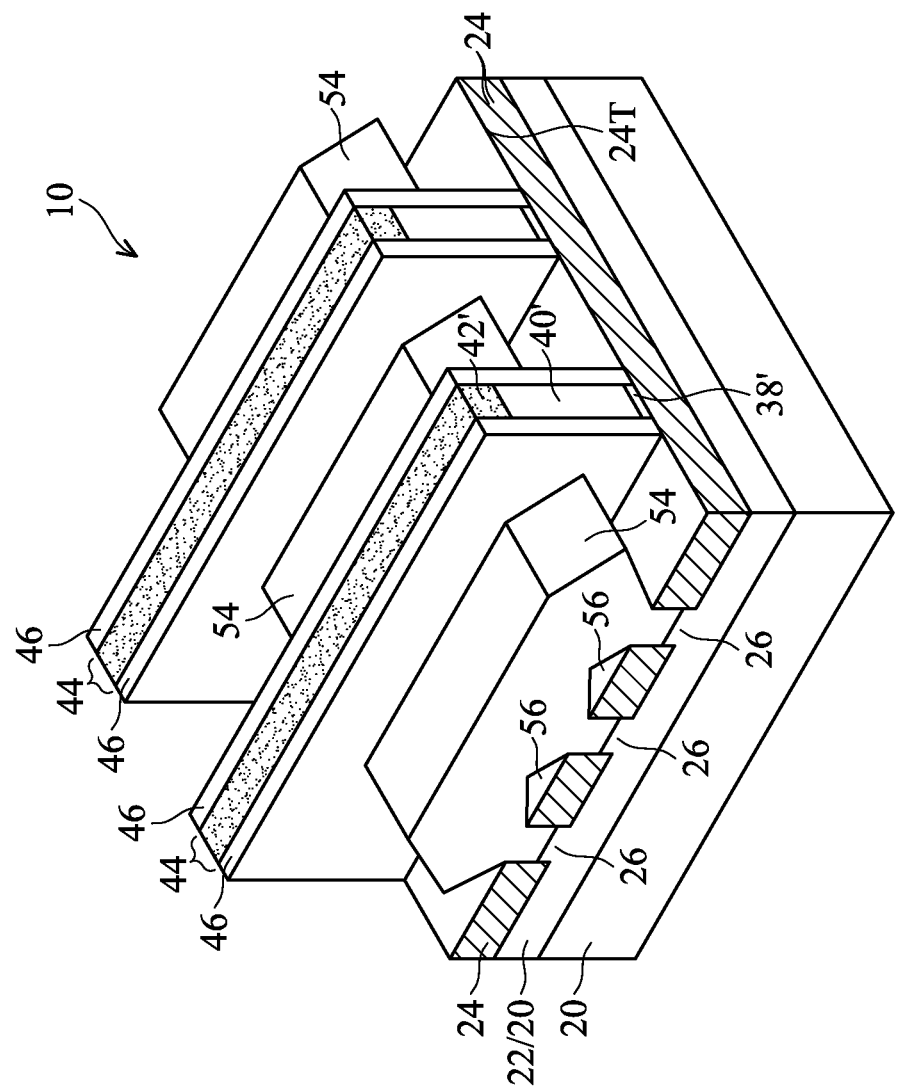

Next, epitaxy regions (source/drain regions) 54 are formed by selectively growing (through epitaxy) a semiconductor material starting from recesses 50, resulting in the epitaxy regions 54 as shown in FIG. 9. The respective process is illustrated as process 220 in the process flow 200 as shown in FIG. 17. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof.

After Recesses 50 are filled with epitaxy regions 54, the further epitaxial growth of epitaxy regions 54 may cause epitaxy regions 54 to expand horizontally, and facets may be formed. The further growth of epitaxy regions 54 may also cause neighboring epitaxy regions 54 to merge with each other. Voids (air gaps) 56 may be generated. After the epitaxy step, epitaxy regions 54 may be further implanted with a p-type or an n-type impurity, which are also denoted using reference numeral 54. In accordance with alternative embodiments of the present disclosure, the implantation step is skipped when epitaxy regions 54 are in-situ doped with the p-type or n-type impurity during the epitaxy.

Figure 10A:
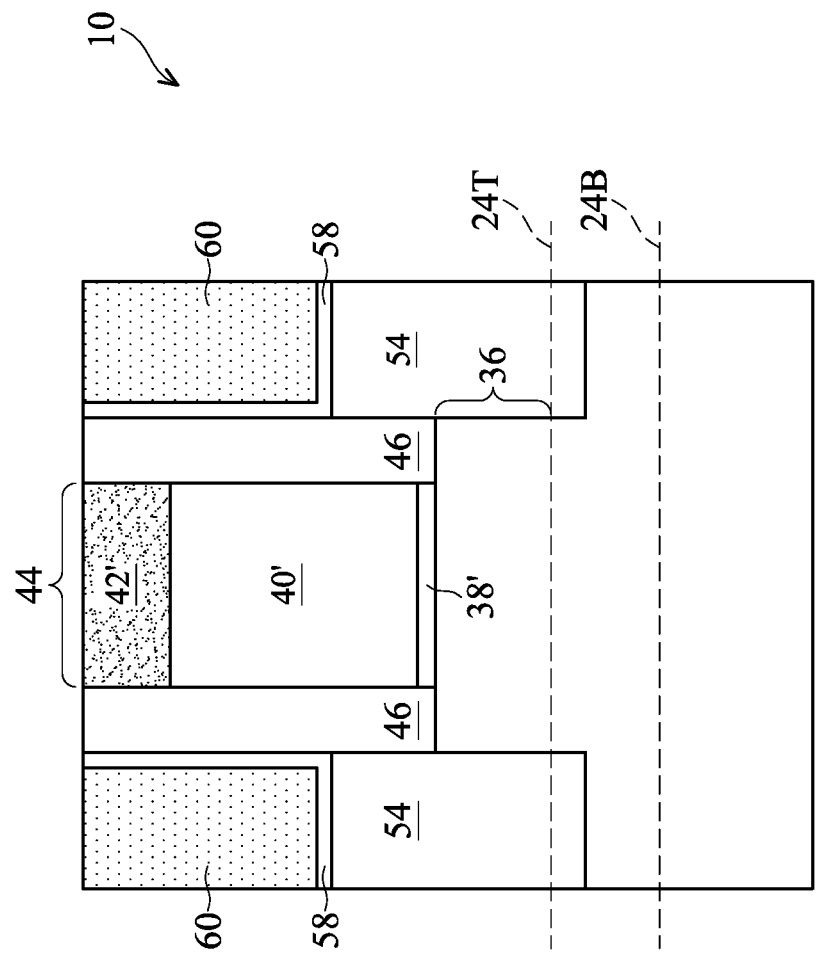
Figure 10B:
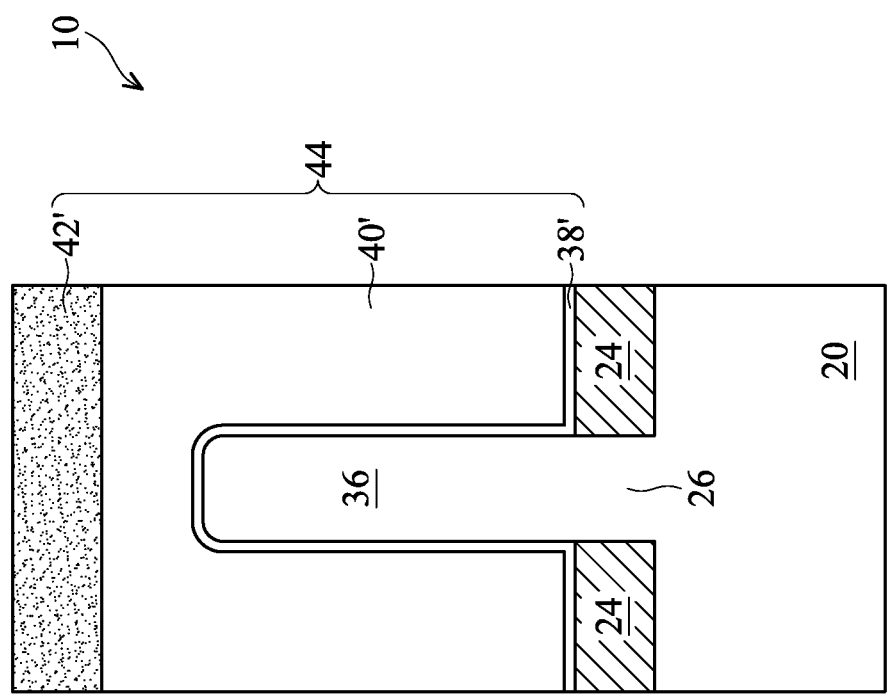
Figure 10C:
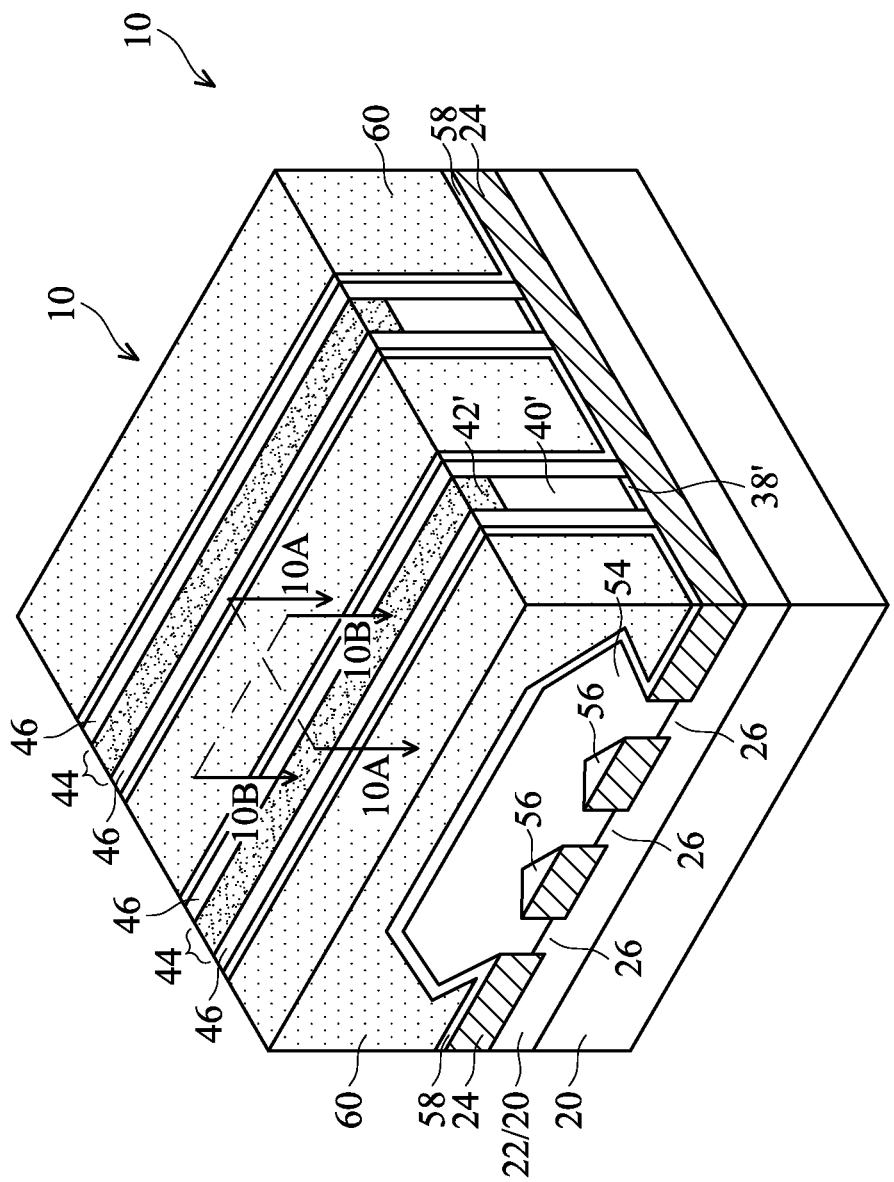

FIGS. 10A, 10B, and 10C illustrate the cross-sectional views and the perspective view in the formation of Contact Etch Stop Layer (CESL) 58 and Inter-Layer Dielectric (ILD) 60. The respective process is illustrated as process 222 in the process flow 200 as shown in FIG. 17. FIG. 10A illustrates the cross-section 10A-10A as shown in FIG. 10C. FIG. 10B illustrates the cross-section 10B-10B as shown in FIG. 10C. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 44, and gate spacers 46 with each other.

Figure 11A:
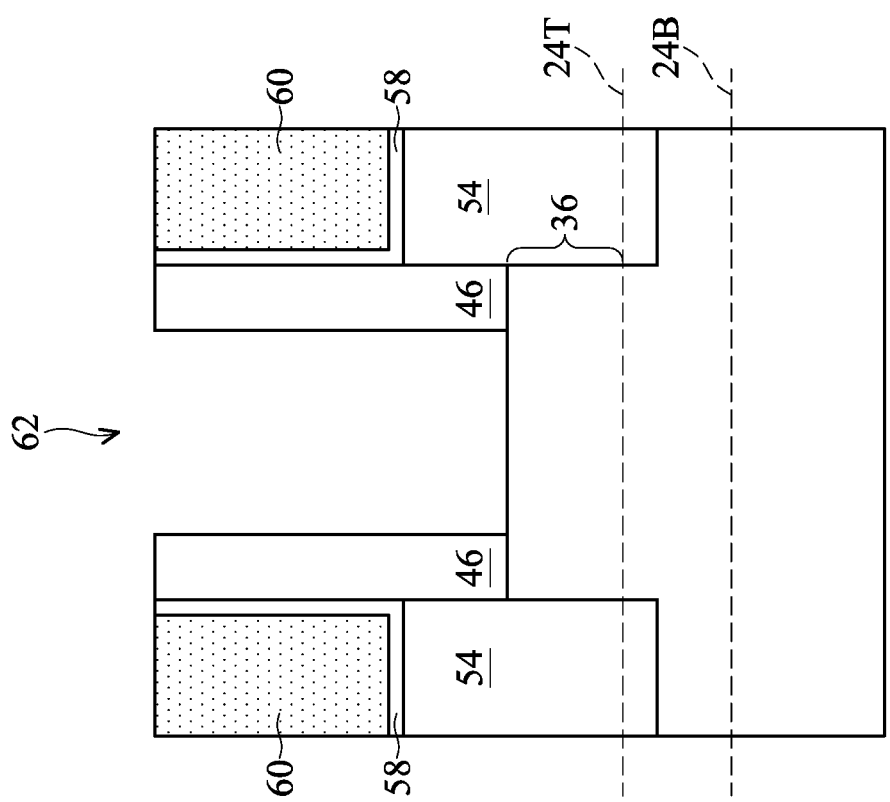
Figure 11B:
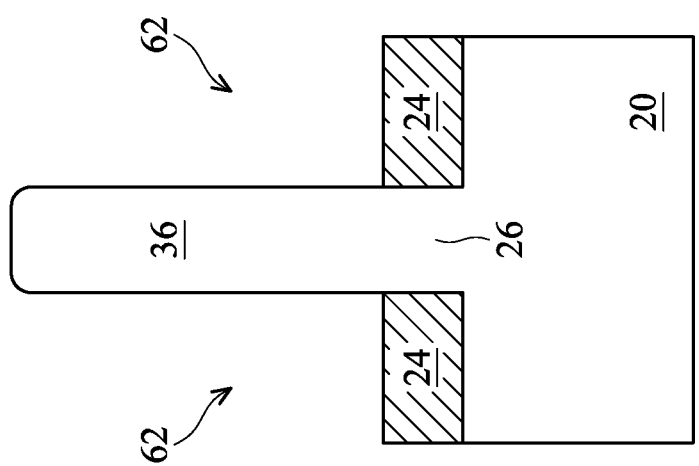
Figure 11C:
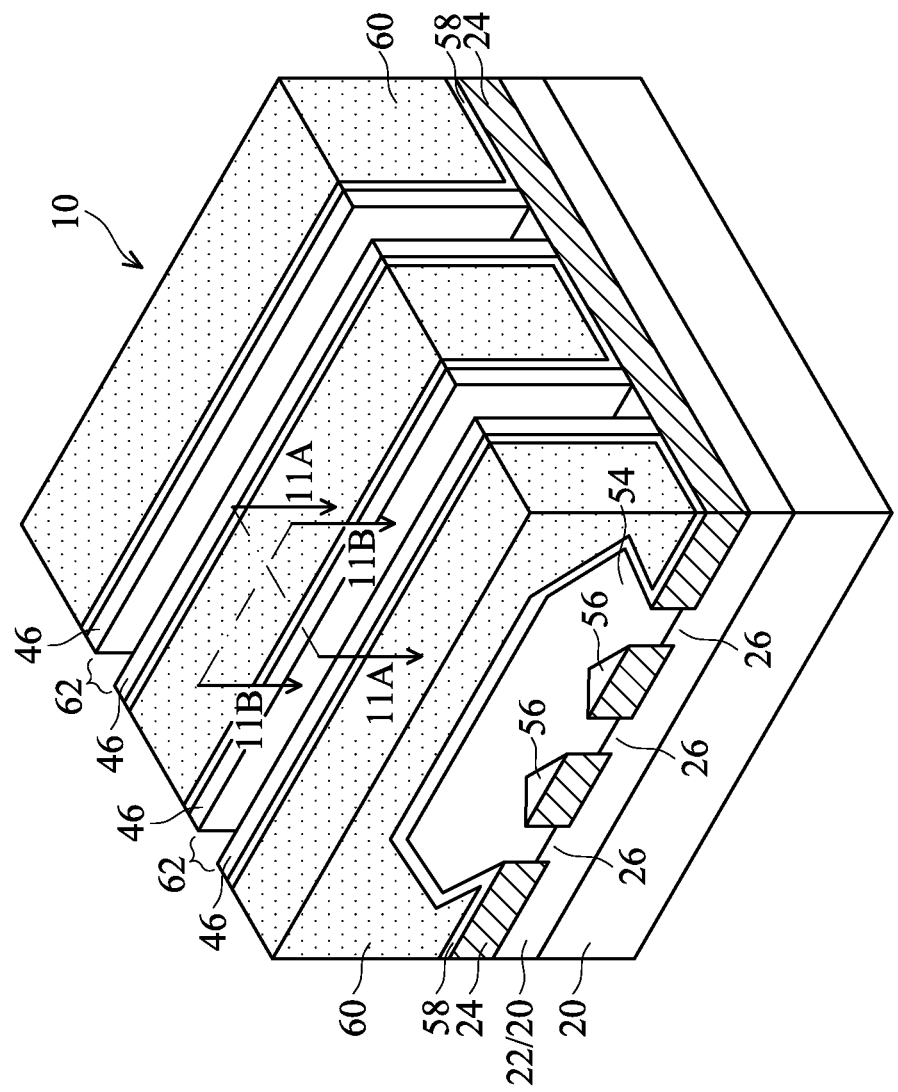

Hard masks 42', dummy gate electrodes 40' and dummy gate dielectrics 38' are then removed, forming trenches 62 between gate spacers 46, as shown in FIGS. 11A, 11B, and 11C. The respective process is illustrated as process 224 in the process flow 200 as shown in FIG. 17. FIG. 11C illustrates a perspective view, and FIGS. 11A and 11B illustrate the cross-sections 11A-11A and 11B-11B, respectively, as shown in FIG. 11C. In accordance with some embodiments, the removal of dummy gates electrodes 40' is performed using an anisotropic etching process, similar to the patterning process as shown in FIG. 6. In accordance with alternative embodiments, the removal of dummy gates electrodes 40' is performed using an isotropic etching process, which may be a wet etching process or a dry etching process. After the removal of dummy gates electrodes 40', dummy gate dielectrics 38' are revealed through trenches 62.

Next, dummy gate dielectrics 38' are removed. In accordance with some embodiments, the etching process may be anisotropic, and the process gas may include the mixture of $NF_3$ and $NH_3$, or the mixture of HF and $NH_3$. The etching process may include isotropic effect and some anisotropic effect to ensure the removal of the sidewall portions of dummy gate dielectrics 38'. In accordance with alternative embodiments, an isotropic etching process such as a wet etching process may be used. For example, a HF solution may be used. The top surfaces and the sidewalls of protruding semiconductor fins 36 are thus exposed to trenches 62, as shown in FIGS. 11A and 11B.

Figure 12A:
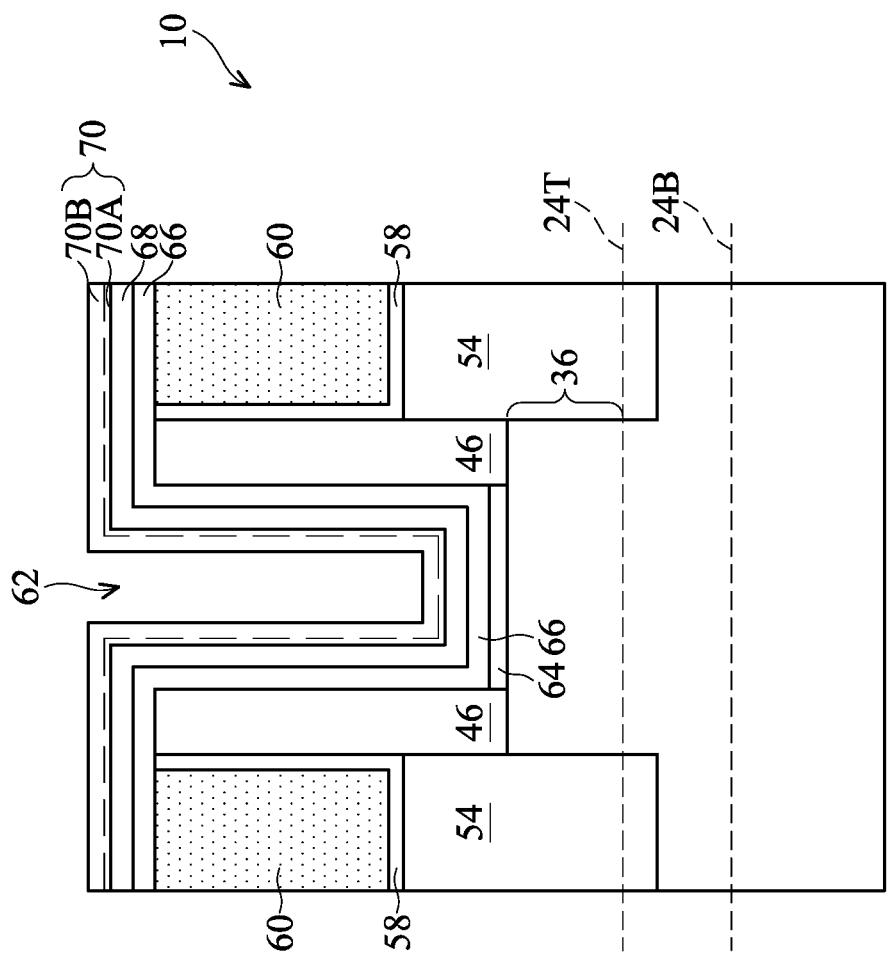
Figure 12B:
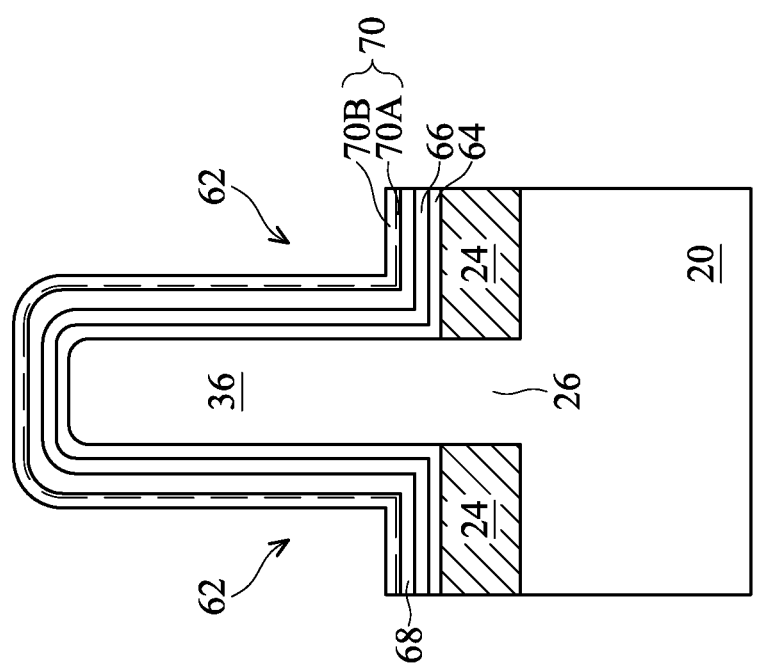

FIGS. 12A and 12B illustrate the cross-sectional views in the formation of Interfacial Layer (IL) 64 on protruding fins 36. The respective process is illustrated as process 226 in the process flow 200 as shown in FIG. 17. In accordance with some embodiments, the formation of IL 64 is performed through an oxidation process. The oxidation process may include a chemical oxidation process, which is performed by exposing wafer 10 to a chemical solution comprising the mixture of one or more of ozonated ($O_3$) De-Ionized (DI) water, hydrogen peroxide ($H_2O_2$) sulfuric acid ($H_2SO_4$), ammonium hydroxide ($NH_4OH$), and the like, or combinations thereof. The oxidation process may also include a thermal oxidation process, in which wafer 10 is annealed in an oxygen-comprising environment including oxygen ($O_2$), ozone ($O_3$), or the like. IL 64 may include silicon oxide ($SiO_2$). In accordance with some embodiments, the thickness of IL 64 may be in the range between about 0.5 nm and about 2 nm. In accordance with some embodiments, IL 64 is deposited.

Next, high-k dielectric layer 66 is deposited over IL 64. The respective process is also illustrated as process 226 in the process flow 200 as shown in FIG. 17. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layer 66 is formed as a conformal layer, and extends on protruding fins 36 and the top surfaces and the sidewalls of gate spacers 46. In accordance with some embodiments of the present disclosure, high-k dielectric layer 66 is formed using ALD, CVD, PECVD, Molecular-Beam Deposition (MBD), or the like. In accordance with some embodiments, the thickness of high-k dielectric layer 66 may be in the range between about 0.5 nm and about 3 nm.

Next, metal-containing capping layer 68 is deposited. The respective process is illustrated as process 228 in the process flow 200 as shown in FIG. 17. Metal-containing capping layer 68 has the function of increasing etching selectivity. Otherwise, if metal-containing capping layer 68 is not formed, in the subsequent removal of the subsequently formed silicon cap layer 70, since the etching selectivity between silicon cap layer 70 and high-k dielectric layer 66 is not high enough, high-k dielectric layer 66 may be damaged. The etching selectivity of metal-containing capping layer 68 relative to high-k dielectric layer 66 is higher than the etching selectivity of silicon cap layer 70 relative to high-k dielectric layer 66. Accordingly, metal-containing capping layer 68 has the function of increasing etching selectivity.

The material of metal-containing capping layer 68 is also selected so that it may have a high etching selectivity in the subsequent removal of metal-containing capping layer 68. In accordance with some embodiments, metal-containing capping layer 68 comprises elemental metal(s) such as Al, Cu, Ti, Co, Hf, Cr, Ta, W, V, Mo, or the like. In accordance with alternative embodiments, metal-containing capping layer 68 may also be a metal compound such as the metal nitrides of the aforementioned metals. The deposition method and the deposition process are adjusted so that metal-containing capping layer 68 is conformal. For example, Physical Vapor Deposition (PVD), ALD, CVD, Plasma-Enhanced Atomic layer deposition (PEALD) or the like may be used to deposit metal-containing capping layer 68. In accordance with some embodiments, the thickness of metal-containing capping layer 68 may be in the range between about 0.5 nm and about 3 nm.

Silicon cap layer 70 is then deposited on metal-containing capping layer 68. The respective process is illustrated as process 230 in the process flow 200 as shown in FIG. 17. In accordance with some embodiments, silicon cap layer 70 is deposited as a conformal layer, with the thicknesses of the horizontal portions being equal to or substantially equal to (for example, with the difference being smaller than about 10 percent) the thicknesses of the vertical portions. The precursors for depositing silicon cap layer 70 may include silane ($SiH_4$), disilane ($Si_2H_6$), dichlorosilane (DCS), or the like, or combinations thereof. The deposition may be performed using a conformal deposition method such as CVD or ALD.

The thickness of silicon cap layer 70 is in a selected range. If the silicon cap layer 70 is too thick, it is difficult to remove in subsequent processes since it fill too much trench 62. If silicon cap layer 70 is too thin, it cannot block oxygen from penetrating through, and may cause the increase in IL 64. In accordance with some embodiments, the thickness of silicon cap layer 70 is in the range between about 0.5 nm and about 1.0 nm. The resulting silicon cap layer 70 may comprise elemental silicon atoms (which are not the compound of silicon with other elements). Silicon cap layer 70 may or may not include silicon compound therein.

In accordance with some embodiments, the deposition of high-k dielectric layer 66, metal-containing capping layer 68, and silicon cap layer 70 are in-situ performed in the same vacuum environment without vacuum break in between. In accordance with alternative embodiments, metal-containing capping layer 68 and silicon cap layer 70 are in-situ performed in the same vacuum environment without vacuum break in between, while there may be vacuum break between the deposition of high-k dielectric layer 66 and the deposition of metal-containing capping layer 68. In accordance with some embodiments, high-k dielectric layer 66, metal-containing capping layer 68, and silicon cap layer 70 are deposited in a plurality of vacuum chambers in a same production tool. The transferring between the different chambers is performed in the same vacuum environment, without the vacuum break. In accordance with alternative embodiments, two or three of high-k dielectric layer 66, metal-containing capping layer 68, and silicon cap layer 70 are deposited in the same vacuum chamber, and the vacuum is maintained throughout the deposition of these layers.

Since there is no vacuum break in the entire period starting from a first time point before the deposition of high-k dielectric layer 66 and ending at a second time point after the deposition of silicon cap layer 70 is finished, high-k dielectric layer 66 and metal-containing capping layer 68 are kept in the vacuum environment without being exposed to oxygen (such as open air). There is no oxygen adsorbed on the surfaces of high-k dielectric layer 66 and metal-containing capping layer 68.

In accordance with some embodiments, during the entire period between (and including) the deposition of high-k dielectric layer 66 and the deposition of silicon cap layer 70, there is no annealing process. In accordance with alternative embodiments, between the deposition of metal-containing capping layer 68 and the deposition of silicon cap layer 70, there is an in-situ annealing process performed. The in-situ annealing process (if performed) is also in-situ performed without vacuum break. The in-situ annealing process may include a spike annealing process, a flash annealing process, or the like. The in-situ annealing process may be performed in oxygen-free process gases such as $N_2$, He, Ar, $H_2$, $NH_3$, or combinations thereof. The wafer temperature in the in-situ annealing process may be in the range between about 300° C. and about 1,000° C. The pressure of the process gases may be in the range between about 1 mTorr and about 1 atm. The annealing duration may be in the range between about 1 microsecond and about 100 seconds.

Figure 13A:
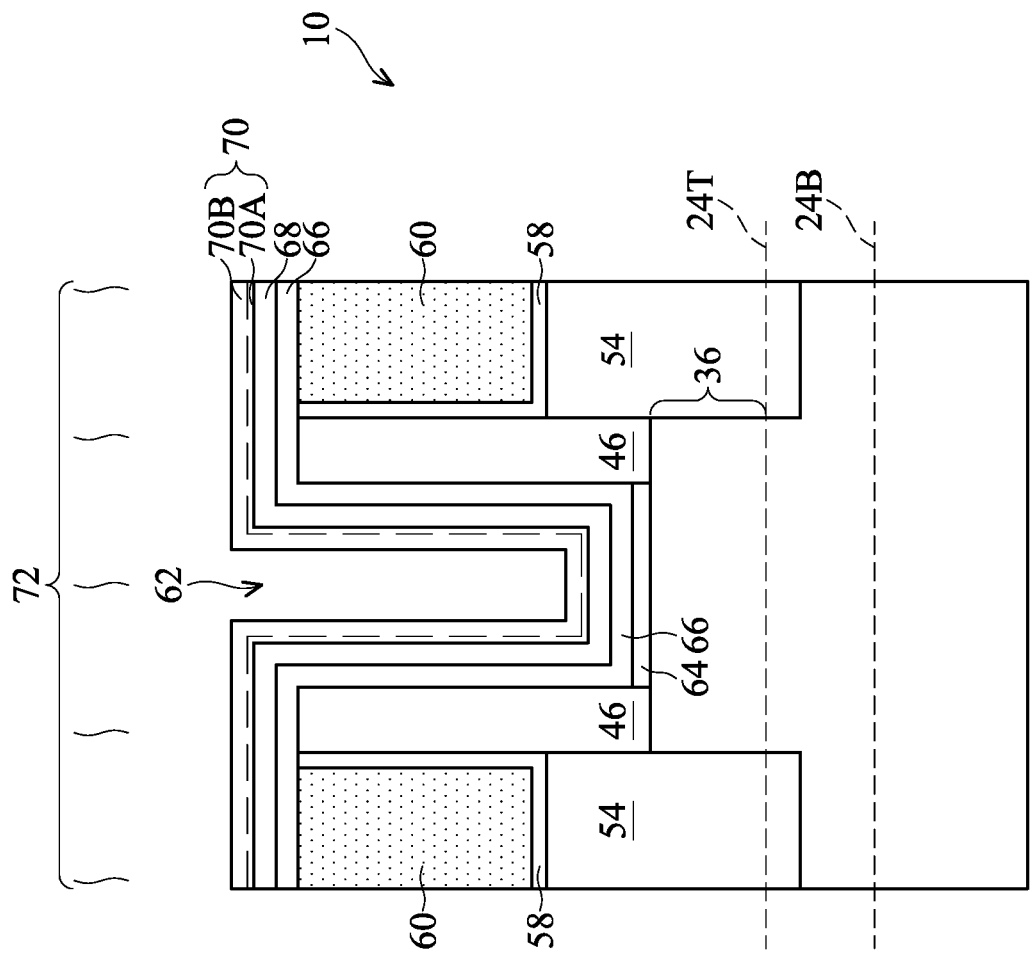
Figure 13B:
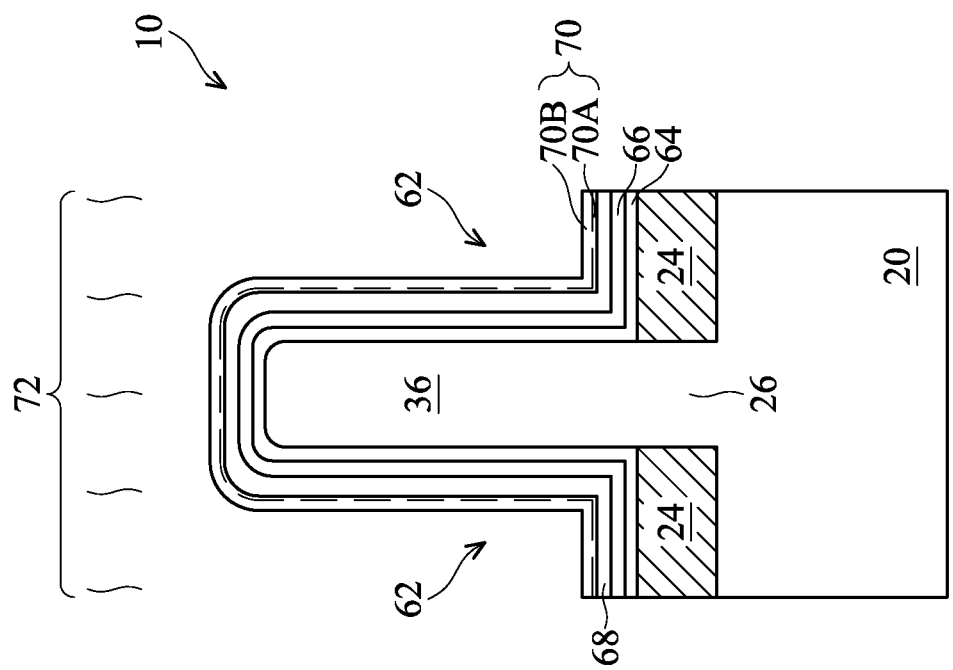

After the deposition of silicon cap layer 70, an annealing process 72 may be performed on wafer 10, as shown in FIGS. 13A and 13B. The respective process is illustrated as process 232 in the process flow 200 as shown in FIG. 17. The annealing process 72 may be performed using oxygen-free gases such as $N_2$, He, Ar, $H_2$, $NH_3$, or combinations thereof as process gases. The annealing process 72 may include a furnace annealing process, a spike annealing process, a flash annealing process, or the like. The annealing process may be performed at a wafer temperature in the range between about 300° C. and about 1,000° C. The pressure of the process gases may be in the range between about 1 mTorr and about 1 atm. The annealing duration may be in the range between about 1 microsecond and about 100 seconds.

In accordance with some embodiments, between the deposition of silicon cap layer 70 and the annealing process 72, a vacuum break may occur, and wafer 10 may be retrieved from the production tool in which high-k dielectric layer 66, metal-containing capping layer 68, and silicon cap layer 70 are deposited. Annealing process 72 is accordingly an ex-situ annealing process. The annealing process (such as annealing process 72 and the in-situ annealing process, if performed) has the function of improve the quality of high-k dielectric layer 66.

Due to the in-situ deposition of silicon cap layer 70 with metal-containing capping layer 68 and high-k dielectric layer 66, the surfaces of both of high-k dielectric layer 66 and metal-containing capping layer 68 are not adsorbed with oxygen, and the thickness of IL 64 is not adversely increased. For example, in the annealing process 72, the thickness of IL 64 may be increased (if any) by a percentage lower than about 20 percent. The increase in the thickness of IL 64 may also be less than about 0.2 nm, and may be less than about 0.1 nm. It is appreciated that silicon cap layer 70 has the function of blocking oxygen from diffusing to protruding semiconductor fins 36, and has the function of preventing IL 64 from being thickened during the annealing process 72. The capability of silicon cap layer 70 in blocking oxygen is also related to its thickness, and a thicker silicon cap layer has better ability of blocking the diffusion of oxygen, and better ability to reduce the adverse increase in the thickness of IL 64.

With the in-situ deposition, the thickness of silicon cap layer 70 may be reduced, while still has the same capability of preventing the increase in the thickness of the IL 64 as a thicker silicon cap layer if silicon cap layer 70 is ex-situ deposited. Otherwise, if silicon cap layer 70 is ex-situ formed, the required thickness of the silicon cap layer may be in the range between about 1.5 nm and about 6 nm, which is three times to six times the thickness of the in-situ silicon cap layer. The ex-situ silicon cap layer with the thickness smaller than about 1.5 nm (or 1.0 nm) cannot effectively block oxygen during the annealing process, hence defeating the purpose of forming the silicon cap layer.

In accordance with alternative embodiments, after the vacuum break, and before annealing process 72, another silicon cap layer 70 is ex-situ deposited on the in-situ deposited silicon cap layer 70. For example, silicon cap layer 70 is illustrated as having the in-situ deposited sub-layer 70A and ex-situ deposited sub-layer 70B. Each of the sub-layers 70A and 70B may be formed using the same processes as discussed in preceding paragraphs, and may include elemental silicon. A dashed line is drawn between sub-layer 70A and sub-layer 70B to indicate that the ex-situ deposition of the silicon cap layer 70 may be performed, or may be omitted. In accordance with these embodiments, annealing process 72 is performed after the deposition of sub-layer 70B, for example. With the sub-layer 70A being in-situ deposited, high-k dielectric layer 66 and metal-containing capping layer 68 are not exposed to oxygen, and again the required thickness of silicon cap layer 70 is reduced.

After annealing process 72, silicon cap layer 70 is removed. The respective process is illustrated as process 234 in the process flow 200 as shown in FIG. 17. In accordance with some embodiments, silicon cap layer 70 is removed using a dry etching process, wherein process gases such as $NF_3$, $NH_3$, HF, $H_2$, and/or the like may be used. Since silicon cap layer 70 is thin, it is easier to remove silicon cap layer 70 without damaging other features. Also, the trench 62 may be formed narrower, while after forming the thin silicon cap layer 70, there is still enough remaining space to allow the etching gases to reach the bottom of trench 62. The process window for removing silicon cap layer 70 is thus increased. In accordance with alternative embodiments, silicon cap layer 70 is removed in a wet etching process, wherein the etching chemical may include KOH, tetramethylammonium hydroxide (TMAH), and/or the like.

Figure 14A:
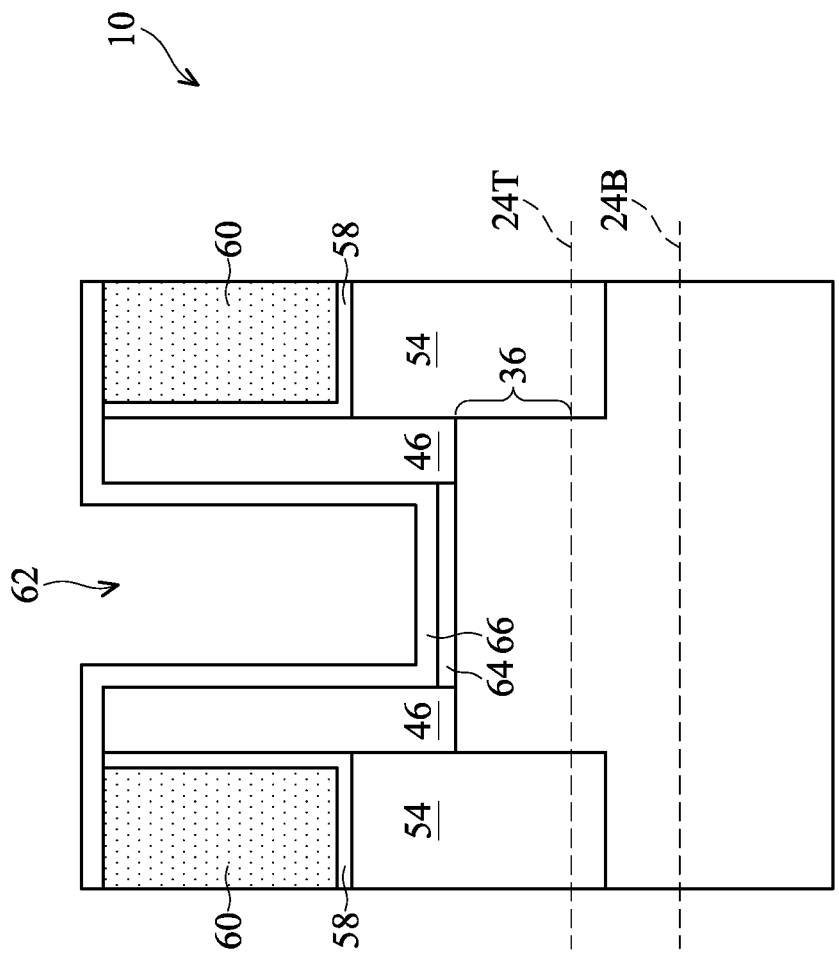
Figure 14B:
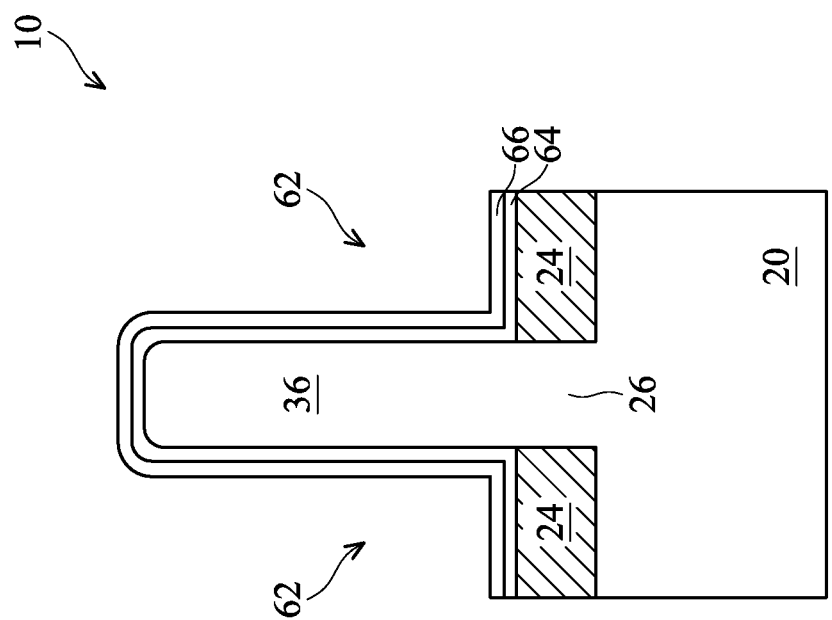

After the removal of silicon cap layer 70, metal-containing capping layer 68 is removed. The respective process is also illustrated as process 234 in the process flow 200 as shown in FIG. 17. High-k dielectric layer 66 is exposed. The resulting structure is shown in FIGS. 14A and 14B. The etching selectivity of metal-containing capping layer 68 to high-k dielectric layer 66 is high, so that high-k dielectric layer 66 is not damaged by the removal of metal-containing capping layer 68. In accordance with some embodiments, metal-containing capping layer 68 is removed through a wet etching process. The wet etching chemical may include $NH_4OH$ and $H_2O_2$, for example.

Figure 15A:
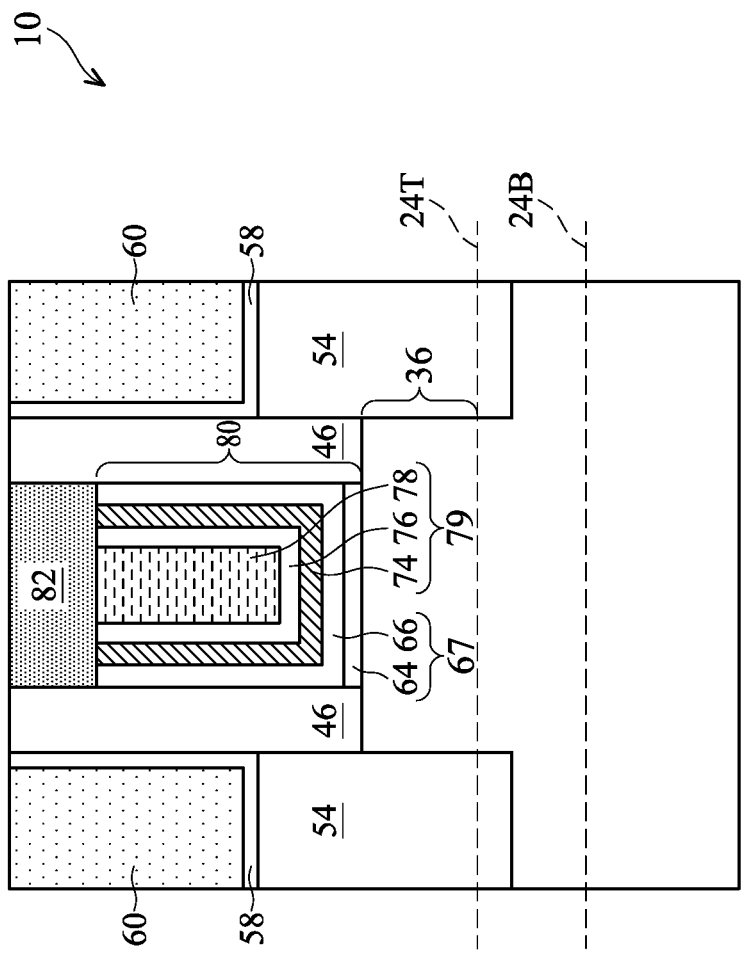
Figure 15B:
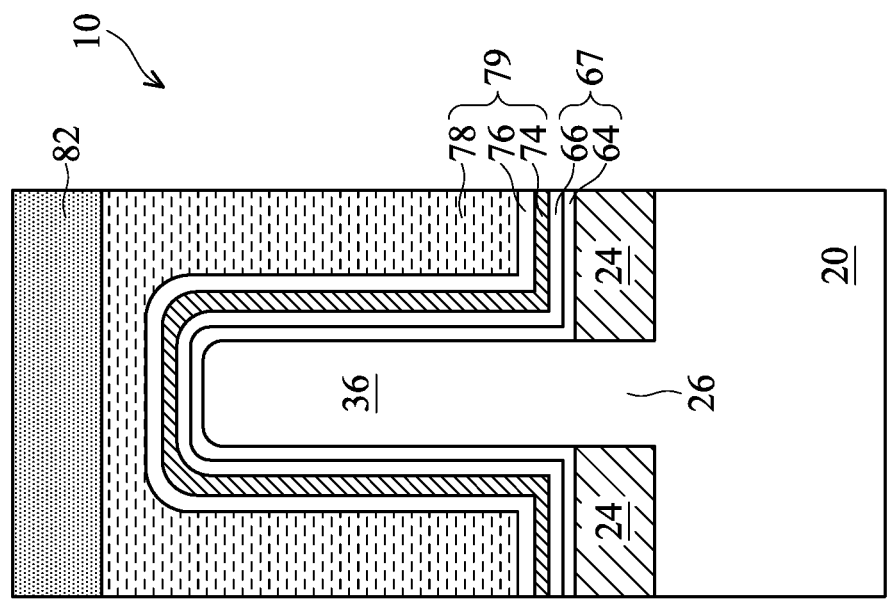
Figure 15C:
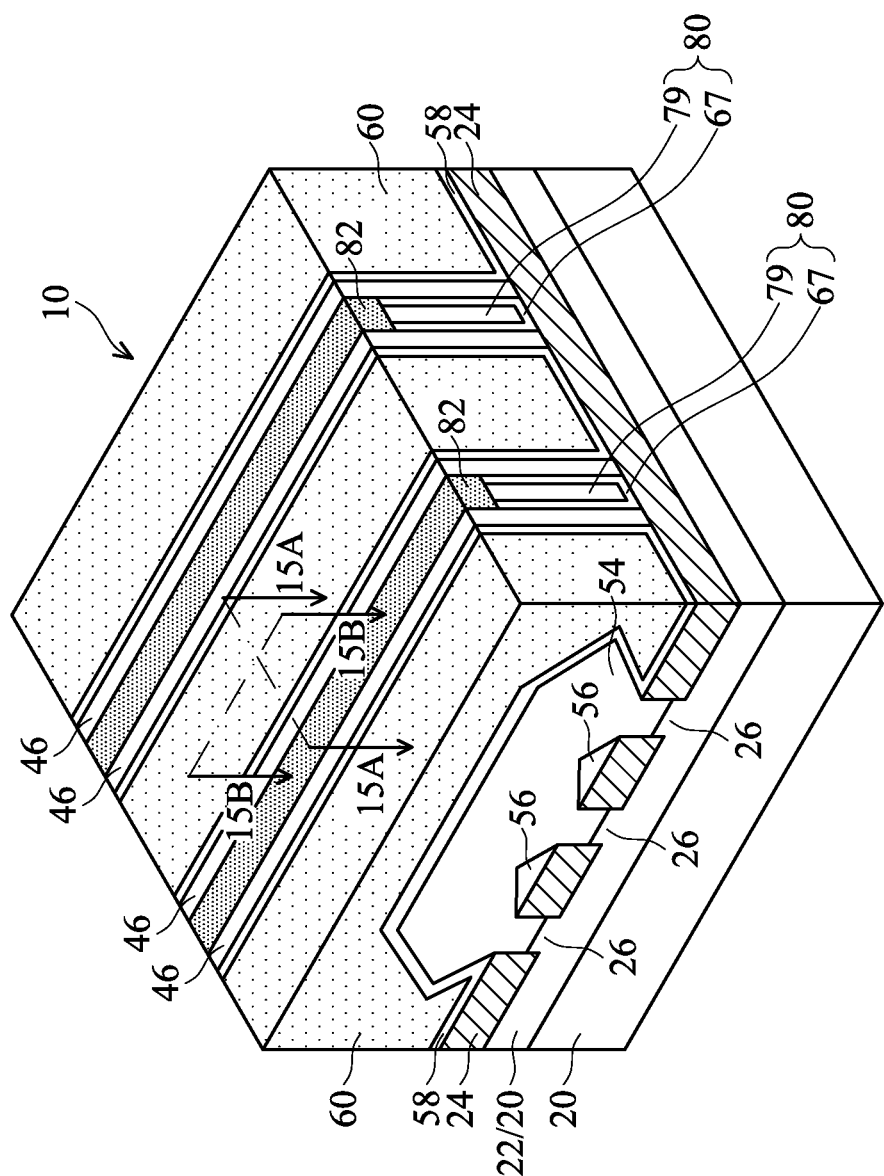

FIGS. 15A, 15B, and 15C illustrate the formation of replacement gate stacks 80 and self-aligned hard masks 82. FIG. 15C illustrates a perspective view, while FIGS. 15A and 15B illustrate the cross-sections 15A-15A and 15B-15B, respectively, as shown in FIG. 15C. Gate stack 80 includes gate dielectric 67 and gate electrode 79. Gate dielectric 67 includes Interfacial Layer IL 64 and high-k dielectric layer 66. In accordance with some embodiments, since high-k dielectric layer 66 has been exposed to open air, in the entire period of time between removing the metal-containing capping layer 68 and depositing the bottom layer in gate electrodes 79, no annealing process is performed.

Gate electrodes 79 are formed on and contacting gate dielectrics 67. The respective process is illustrated as process 236 in the process flow 200 as shown in FIG. 17. A gate electrode 79 may include stacked layers (FIG. 15B), which may include a diffusion barrier layer (a capping layer, not shown), and one or more work-function layer 74 over the diffusion barrier layer. The diffusion barrier layer may be formed of TiN, TiSiN, or the like. The work-function layer determines the work-function of the gate electrode 79, and includes at least one layer, or a plurality of layers formed of different materials. The specific material of the work-function layer may be selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and possibly a TiN layer. After the deposition of the stacked layers 74, blocking layer 76, which may be another TiN layer, may be formed. Blocking layer 76 may be formed using CVD.

Next, metal-filling region 78 is deposited. The formation of metal-filling region 78 may be achieved through CVD, ALD, PVD, or the like. Metal-filling region 78 may be formed of or comprise cobalt, tungsten, alloys thereof, or other metal or metal alloys. Next, a planarization process such as a CMP process or a mechanical grinding process is performed, so that the top surface of gate stack 80 is coplanar with the top surface of ILD 60.

In a subsequent process, gate stacks 80 are etched back, resulting in recesses to be formed between opposite gate spacers 46. Next, hard masks 82 are formed over replacement gate stack 80. The respective process is illustrated as process 238 in the process flow 200 as shown in FIG. 17. In accordance with some embodiments of the present disclosure, the formation of hard masks 82 includes a deposition process to form a blanket dielectric material, and a planarization process to remove the excess dielectric material over gate spacers 46 and ILD 60. Hard masks 82 may be formed of silicon nitride, for example, or other like dielectric materials.

Figure 16:
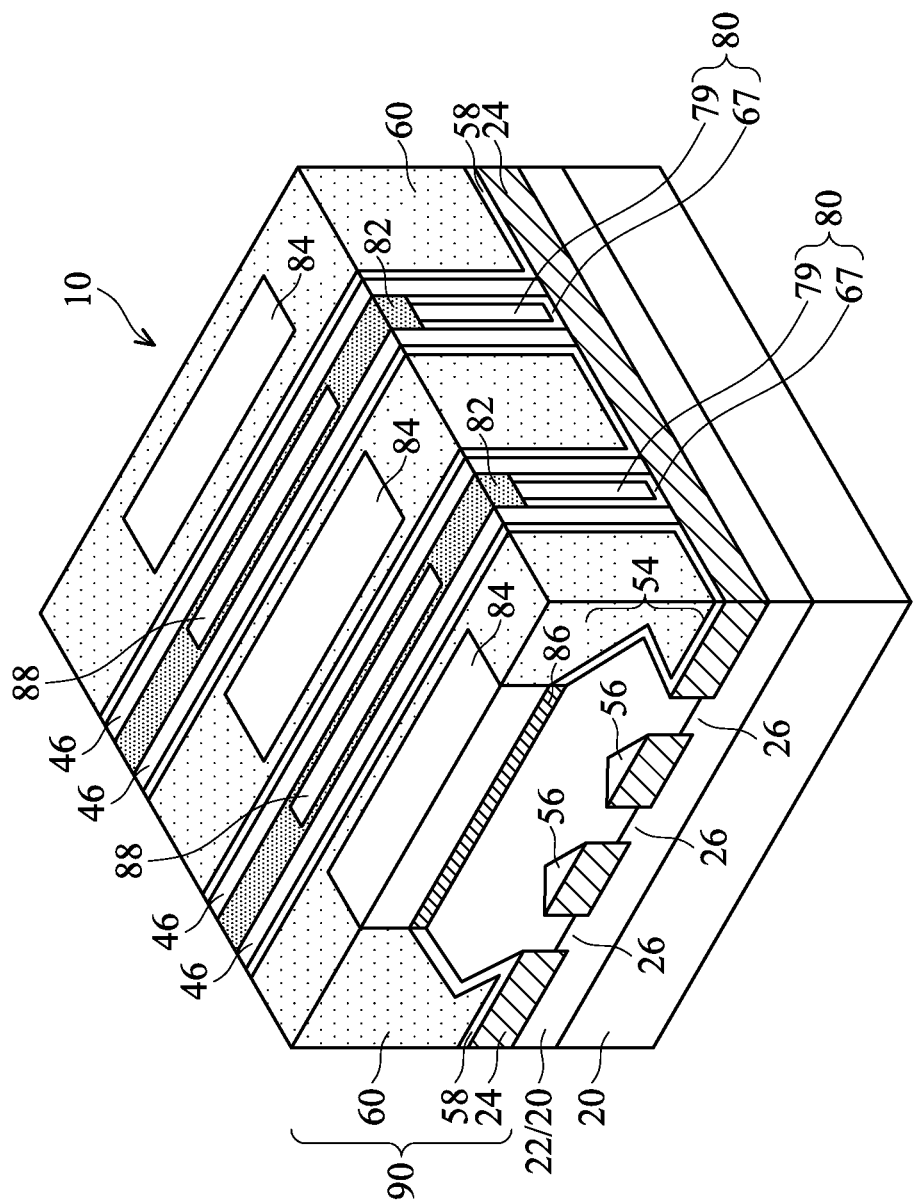
Figure 17:
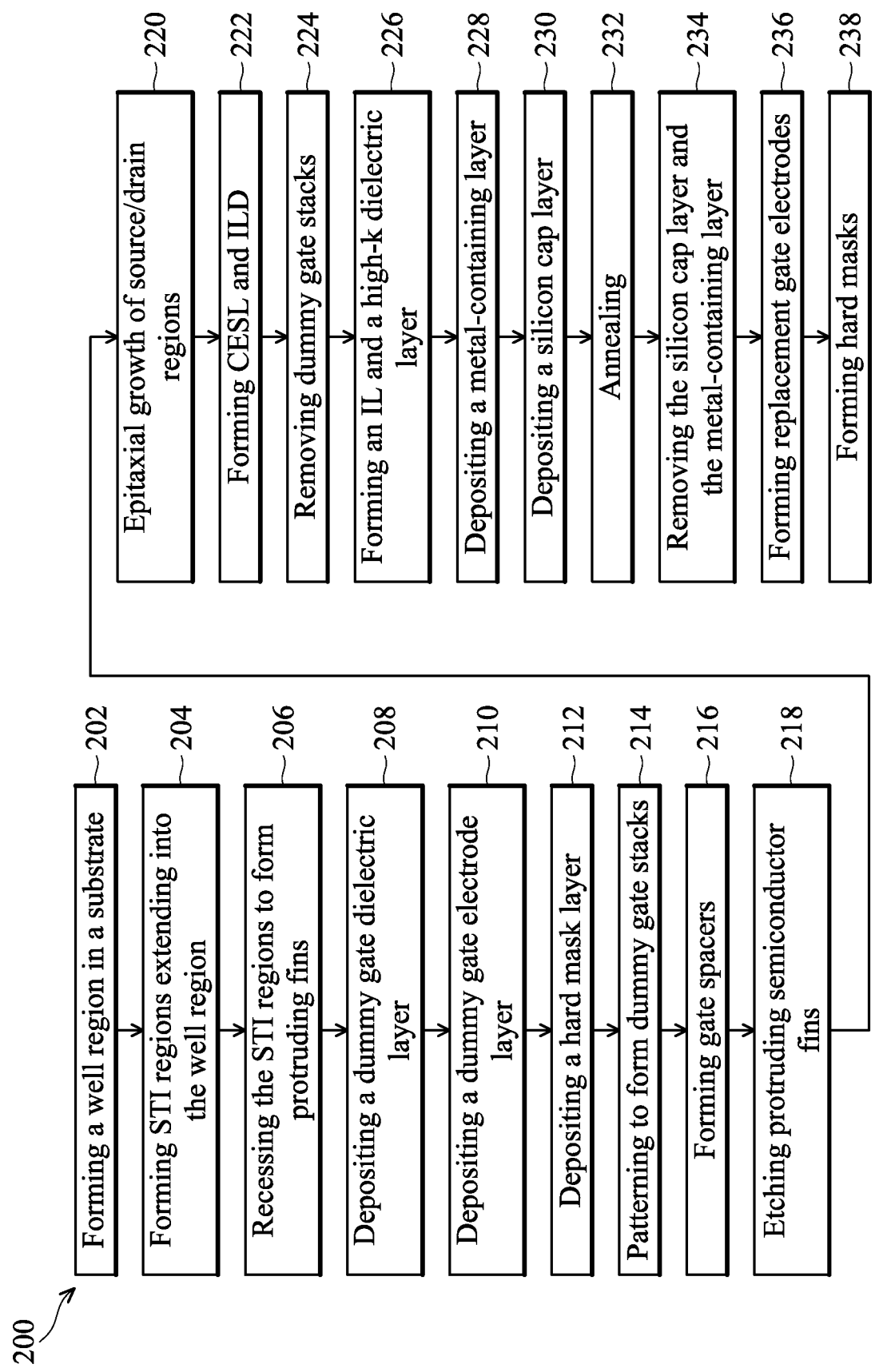
FIG. 17 illustrates a process flow for forming a FinFET in accordance with some embodiments.

FIG. 16 illustrates some of the features formed in subsequent processes, which may include source/drain contact plugs 84, source/drain silicide regions 86, and gate contact plugs 88. The details of the processes are not discussed herein. FinFET 90 is thus formed.

The embodiments of the present disclosure have some advantageous features. By in-situ depositing a silicon cap layer on a metal-containing capping layer, which is further deposited on a high-k gate dielectric layer, the silicon cap layer may be thinner without sacrificing its ability of blocking oxygen from reaching the protruding semiconductor fins. The adverse increase in the interfacial layer is reduced. The process window is thus increased.

In accordance with some embodiments of the present disclosure, a method comprises forming a dummy gate stack on a semiconductor region; forming gate spacers on sidewalls of the dummy gate stack; removing the dummy gate stack to form a recess between the gate spacers; forming a silicon oxide layer on the semiconductor region, wherein the silicon oxide layer extends into the recess; depositing a high-k dielectric layer over the silicon oxide layer; depositing a silicon layer over the high-k dielectric layer, wherein the silicon layer extends into the recess, and wherein the high-k dielectric layer and the silicon layer are in-situ deposited in a same vacuum environment; performing an annealing process on the silicon layer and the high-k dielectric layer; removing the silicon layer; and forming a gate electrode over the high-k dielectric layer, wherein the gate electrode fills the recess.

In an embodiment, the method further comprises depositing a metal-containing capping layer over the high-k dielectric layer, wherein the silicon layer is deposited over the metal-containing capping layer, and wherein the high-k dielectric layer, the metal-containing capping layer, and the silicon layer are in-situ deposited in the same vacuum environment. In an embodiment, the metal-containing capping layer comprises a metal selected from the group consisting of Al, Cu, Ti, Co, Hf, Cr, Ta, W, V, Mo, and combinations thereof. In an embodiment, the method further comprises, after the annealing process, removing the metal-containing capping layer. In an embodiment, the method further comprises, after the same vacuum environment is broken and before the annealing process, depositing an additional silicon layer over the silicon layer.

In an embodiment, the method further comprises, before the same vacuum environment is broken, performing an additional annealing process. In an embodiment, the silicon layer has a thickness smaller than about 1 nm. In an embodiment, the thickness of the silicon layer is in a range between about 0.5 nm and about 1 nm. In an embodiment, the silicon layer is removed using a process gas selected from the group consisting of $NF_3$, $NH_3$, HF, $H_2$, and combinations thereof. In an embodiment, the annealing process is performed at a temperature in a range between about 300° C. and about 1,000° C.

In accordance with some embodiments of the present disclosure, a method comprises depositing a high-k dielectric layer over a protruding semiconductor fin; depositing a metal layer over and contacting the high-k dielectric layer; depositing a silicon layer over the metal layer, wherein the metal layer and the silicon layer are in-situ deposited; performing an annealing process on the silicon layer, the metal layer, and the high-k dielectric layer; and removing the silicon layer and the metal layer to expose the high-k dielectric layer. In an embodiment, the high-k dielectric layer, the metal layer, and the silicon layer are in-situ deposited in a same vacuum environment. In an embodiment, the silicon layer has a thickness smaller than about 1 nm. In an embodiment, the thickness of the silicon layer is in a range between about 0.5 nm and about 1 nm. In an embodiment, the method further comprises, after the silicon layer and the metal layer are removed, forming a gate electrode over and contacting the high-k dielectric layer.

In accordance with some embodiments of the present disclosure, a method comprises forming a source/drain region extending into a first part of a semiconductor region; forming an interfacial layer on a second part of the semiconductor region; depositing a high-k gate dielectric layer over the interfacial layer; depositing a metal layer over and contacting the high-k gate dielectric layer; depositing a silicon layer over the metal layer, wherein the silicon layer has a thickness smaller than about 1 nm; with the silicon layer being over the metal layer, performing an annealing process; removing the silicon layer and the metal layer; and forming a gate electrode over the high-k gate dielectric layer to form a gate stack. In an embodiment, the thickness of the silicon layer is in a range between about 0.5 nm and about 1 nm. In an embodiment, the high-k gate dielectric layer, the metal layer, and the silicon layer are in-situ deposited in a same vacuum environment. In an embodiment, the annealing process is performed outside of the same vacuum environment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate stack on a semiconductor region;
    forming gate spacers on sidewalls of the dummy gate stack;
    removing the dummy gate stack to form a recess between the gate spacers;
    forming a silicon oxide layer on the semiconductor region, wherein the silicon oxide layer extends into the recess;
    depositing a high-k dielectric layer over the silicon oxide layer;
    depositing a silicon layer over the high-k dielectric layer, wherein the silicon layer extends into the recess, and wherein the high-k dielectric layer and the silicon layer are in-situ deposited in a same vacuum environment;
    performing an annealing process on the silicon layer and the high-k dielectric layer;
    removing the silicon layer; and
    forming a gate electrode over the high-k dielectric layer, wherein the gate electrode fills the recess.

2. The method of claim 1 further comprising depositing a metal-containing capping layer over the high-k dielectric layer, wherein the silicon layer is deposited over the metal-containing capping layer, and wherein the high-k dielectric layer, the metal-containing capping layer, and the silicon layer are in-situ deposited in the same vacuum environment.

3. The method of claim 2, wherein the metal-containing capping layer comprises a metal selected from the group consisting of Al, Cu, Ti, Co, Hf, Cr, Ta, W, V, Mo, and combinations thereof.

4. The method of claim 2 further comprising, after the annealing process, removing the metal-containing capping layer.

5. The method of claim 1 further comprising, after the same vacuum environment is broken and before the annealing process, depositing an additional silicon layer over the silicon layer.

6. The method of claim 1 further comprising, before the same vacuum environment is broken, performing an additional annealing process.

7. The method of claim 1, wherein the silicon layer has a thickness smaller than about 1 nm.

8. The method of claim 7, wherein the thickness of the silicon layer is in a range between about 0.5 nm and about 1 nm.

9. The method of claim 1, wherein the silicon layer is removed using a process gas selected from the group consisting of $NF_3$, $NH_3$, HF, $H_2$, and combinations thereof.

10. The method of claim 1, wherein the annealing process is performed at a temperature in a range between about 300° C. and about 1,000° C.

11. A method comprising:
    depositing a high-k dielectric layer over a protruding semiconductor fin;
    depositing a metal layer over and contacting the high-k dielectric layer;
    depositing a silicon layer over the metal layer, wherein the metal layer and the silicon layer are in-situ deposited;
    performing an annealing process on the silicon layer, the metal layer, and the high-k dielectric layer; and
    removing the silicon layer and the metal layer to expose the high-k dielectric layer.

12. The method of claim 11, wherein the high-k dielectric layer, the metal layer, and the silicon layer are in-situ deposited in a same vacuum environment.

13. The method of claim 11, wherein the silicon layer has a thickness smaller than about 1 nm.

14. The method of claim 13, wherein an increase in the thickness of the silicon layer caused by the annealing process is smaller than about 20 percent of the thickness of the silicon layer.

15. The method of claim 13, wherein the thickness of the silicon layer is in a range between about 0.5 nm and about 1 nm.

16. The method of claim 11 further comprising, after the silicon layer and the metal layer are removed, forming a gate electrode over and contacting the high-k dielectric layer.

17. A method comprising:
    forming a source/drain region extending into a first part of a semiconductor region;
    forming an interfacial layer on a second part of the semiconductor region;
    depositing a high-k gate dielectric layer over the interfacial layer;
    depositing a metal layer over and contacting the high-k gate dielectric layer;
    depositing a silicon layer over the metal layer, wherein the silicon layer has a thickness smaller than about 1 nm;
    with the silicon layer being over the metal layer, performing an annealing process;
    removing the silicon layer and the metal layer, wherein the high-k gate dielectric layer, the metal layer, and the silicon layer are in-situ deposited in a same vacuum environment; and
    forming a gate electrode over the high-k gate dielectric layer to form a gate stack.

18. The method of claim 17, wherein the thickness of the silicon layer is in a range between about 0.5 nm and about 1 nm.

19. The method of claim 17, wherein the annealing process is performed outside of the same vacuum environment.

20. The method of claim 17, wherein when the annealing process is performed, the silicon layer is a topmost layer of a respective wafer.

* * * * *